United States Patent
Schaeffter et al.

(10) Patent No.: US 6,466,015 B2
(45) Date of Patent: Oct. 15, 2002

(54) PHASE CORRECTION METHOD FOR REAL-TIME MR IMAGING

(75) Inventors: Tobias Schaeffter, Hamburg (DE); Peter Koken, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/982,263

(22) Filed: Oct. 17, 2001

(65) Prior Publication Data

US 2002/0048340 A1 Apr. 25, 2002

(30) Foreign Application Priority Data

Oct. 18, 2000 (DE) .......................................... 100 51 594

(51) Int. Cl.[7] ................................................. G01V 3/00
(52) U.S. Cl. ........................ 324/309; 324/307; 324/314
(58) Field of Search ................................. 324/309, 306, 324/307, 312, 314, 300; 600/412, 410

(56) References Cited

U.S. PATENT DOCUMENTS

| 4,876,507 A | * | 10/1989 | Van Vaals ................... 324/309 |
| 5,151,656 A | * | 9/1992 | Maier et al. ................. 324/309 |
| 5,184,073 A | * | 2/1993 | Takuchi et al. .............. 324/309 |
| 5,323,110 A | * | 6/1994 | Zang ........................... 324/309 |
| 5,498,963 A | * | 3/1996 | Schneider et al. ........... 324/309 |
| 5,942,897 A | | 8/1999 | Kanazawa ................... 324/309 |
| 6,057,686 A | | 5/2000 | Van Den Brink et al. .. 324/309 |
| 6,259,250 B1 | * | 7/2001 | Mock .......................... 324/309 |

FOREIGN PATENT DOCUMENTS

EP 0909958 A2 4/1999 ......... G01R/33/561

* cited by examiner

Primary Examiner—Edward Lefkowitz
Assistant Examiner—Brij B. Shrivastav
(74) Attorney, Agent, or Firm—John Vodopia

(57) ABSTRACT

The invention relates to an MR imaging method, notably for real-time imaging, in which the phase errors that occur in the MR signals because of inter alia eddy currents, are continuously monitored on the basis of the MR data sets acquired for imaging. To this end, MR signals that are successively acquired with different read-out gradients are related to one another in order to detect changes in the eddy current behavior on the basis of the phase differences. If necessary, calibration measurements are initiated so as to determine phase correction profiles whereby the phase errors of the MR data sets are compensated. For the imaging in accordance with the invention use can be made of Echo Planar Imaging (EPI) sequences for which individual, successively acquired echo signals are related to one another in order to monitor the phase errors. These echo signals are measured with the same phase encoding and with each time opposed read-out gradients for this purpose.

10 Claims, 3 Drawing Sheets

PHASE CORRECTION METHOD FOR REAL-TIME MR IMAGING

The invention relates to an MR imaging method, notably for real-time imaging, wherein temporally successive MR data of an object to be examined is acquired by the repeated application of imaging pulse sequences, said MR data being subjected to phase correction in order to compensate for phase errors.

The invention also relates to an MR apparatus for carrying out the method which includes a gradient coil system for generating magnetic field gradients, an RF coil system for generating RF pulses and for receiving MR signals, a control unit which controls the gradient coils and RF coils so as to apply imaging pulse sequences to an examination zone, and a reconstruction unit whereby MR data is stored and subjected to a phase correction in order to compensate for phase errors.

The invention also relates to a computer program for controlling the MR apparatus.

In recent years numerous technical developments of the hardware and software of MR apparatus were aimed at achieving a drastic reduction of the image acquisition times. The image rate that can be achieved has meanwhile become so high, that real-time MR imaging has become an important tool in various medical applications. Real-time MR imaging is of special interest for diagnosis in the field of cardiology, for example for dynamic examinations of the function of the coronary vessels and the cardiac muscle. Further possible applications can be found in the field of interventional radiology, for example, for monitoring minimal invasive interventions, biopsies etc. that are performed with an MR tomography apparatus. The users of such methods need high quality images with an as high as possible image rate, for example, in order to enable continuous observation of the motions of the cardiac muscle or the interventional instruments, that is, in real time. Therefore, there is serious interest for further improvement and acceleration of the methods for real-time MR imaging.

As is generally known, magnetic resonance tomography is a spectral imaging method wherein a spatially inhomogeneous magnetic field (magnetic field gradients) is used to localize the nuclear magnetization on the basis of the respective associated resonance frequency. It is common practice to record the magnetic resonance signal as a voltage, induced in a coil that encloses the examination zone, under the influence of a suitable sequence of RF pulses and gradient pulses in the time domain. The actual image reconstruction is performed by Fourier transformation of the time signals. The number, the distance in time, the duration and the strength of the gradient pulses and RF pulses used govern the sampling of the reciprocal so-called k space which determines the volume to be imaged and also the image resolution. Similarly, the requirements imposed as regards image format and image resolution determine the number of phase encoding steps required, and hence also the duration of the imaging sequence. The EPI (Echo Planar Imaging) sequence is a customarily used pulse sequence for the sequential sampling of the k space and enables fast imaging and hence is very important for real-time MR imaging. Such an imaging pulse sequence produces a two-dimensional image of a selected slice in the volume to be examined.

An MR imaging method of the kind set forth is disclosed, for example, in U.S. Pat. No. 5,621,321. The MR data sets in the known method are acquired by means of a suitable imaging pulse sequence and subjected to a phase correction in order to compensate for phase errors which would otherwise give rise to undesirable image artefacts. It is a generally known phenomenon that initially the MR signals still suffer from phase errors which are caused partly by so-called eddy currents which are induced in the vicinity of the examination zone by the magnetic fields of the imaging pulse sequences that vary quickly in time. According to the known method a phase correction profile is determined by means of a calibration pulse sequence, said phase correction profile being used to compensate for the phase errors present in the actual MR image data. The phase correction profile consists of a set of complex phase factors which enable a linear and a non-linear phase correction of the overall MR signal.

The eddy current behavior, having a decisive effect on the phase errors of the MR signals, is dependent to a high degree on the direction, the number and the strength of the gradient pulses used and also on the relative position of the object to be examined within the MR system. This means that the phase errors change as soon as, for example, the position and the orientation of the image plane are modified or as soon as the position of the object to be examined changes. Consequently, the phase correction profile is also highly dependent on the selected image plane and in the known method it must be measured again by means of the calibration pulse sequence as soon as the position of the image plane is changed or as soon as the position of the patient in the MR apparatus changes. Moreover, slow variations occur in the eddy current behavior; such variations are caused by thermal effects on the MR apparatus and also necessitate updating of the phase correction profile.

For many real-time MR imaging applications it is necessary to perform interactive adaptation of the position of the image plane during the continuous imaging in order to enable optimum and continuous tracking of given motions, for example, of interventional instruments. In conformity with the known MR imaging method it would then be necessary to measure the phase correction profile all the time again by means of the calibration pulse sequence, thus leading to an undesirable delay of the imaging because a significant part of the overall measuring time is used for the determination of the phase correction profiles.

The eddy current behavior of an MR system is extremely complex and very difficult to predict. Therefore, there is a possibility that given changes of the position of the image plane lead to small changes only of the phase errors. In that case the repeated measurement of the phase correction profiles for each change of the image plane is an unnecessary waste of costly measuring time in given circumstances.

Therefore, it is an object of the present invention to provide an improved MR imaging method in which the image rate is further increased in comparison with the known method in that the measuring time that has to be spent on determining the phase correction profiles is reduced as much as possible.

This object is achieved by means of an MR imaging method of the kind set forth in that the phase errors are continuously monitored in parallel with the application of the imaging pulse sequences in that MR data acquired at different instants are related to one another.

The invention is based on the idea to use the MR data sets acquired for imaging also for the purpose of monitoring the behavior of the phase errors continuously, without it being necessary to perform time and again time-consuming calibration measurements so as to obtain the phase correction profiles. Changes in the eddy current behavior, caused by changes of the image plane, by motions of the object to be examined or by thermal drift, can be recorded on the basis of the phase errors when at least two MR data sets that have been acquired at different instants are related to one another. It is notably when a series of EPI sequences is used for imaging that changes in the eddy current behavior can be detected already on the basis of two individual echo signals that have been acquired separately in time.

For the monitoring of the phase errors in accordance with the invention, MR data acquired with the same phase encoding and with oppositely directed but equal read-out gradients are related to one another. The phase of the acquired MR signals is influenced not only by the described eddy currents, but also by inhomogeneities of the steady magnetic field and by the chemical shift of the excited nuclear magnetization. These different components must be separated during the phase correction so that, if possible, only the phase errors that are due to the eddy currents are compensated. This is achieved by determining the phase differences between MR signals, such as single echo signals in a series of EPI sequences, that have been acquired with the same phase encoding and with respective opposed read-out gradients. The phase differences thus obtained are based essentially on the effects of the eddy currents, so that continuous monitoring of changes in the eddy current behavior can take place on the basis of such phase differences.

MR signals acquired with the same phase encoding and with opposed, equal read-out gradients can be advantageously combined so as to calculate a phase correction profile. This is because a phase correction profile can be generated from the phase differences between these signals; this phase correction profile can be used to compensate for the phase errors of the MR data. The distance in time between the acquisition of the MR data thus combined preferably is not very large, so that the instantaneous phase errors can be correctly determined and corrected on the basis of the phase differences thus determined.

As soon as a significant change of the phase errors is recorded in accordance with the invention, a calibration pulse sequence can be initiated in order to measure a phase correction profile. In comparison with the known MR imaging method this offers the advantage that a calibration measurement is automatically performed only if it is really necessary, that is, when the eddy current behavior has changed to such an extent that the relevant phase correction profile used is no longer valid. The measuring time required for the phase correction by way of the additional calibration pulse sequence is thus minimized. During the continuous monitoring of the phase errors in accordance with the invention a statistical analysis of the phase difference profiles determined can be carried out; for these profiles a threshold value can be preset in order to evaluate the significance of the changes in the eddy current behavior on the basis thereof.

For the MR imaging method in accordance with the invention it is advantageous to change the sign of the read-out gradients in the successively applied imaging pulse sequences. This is because alternately MR signals, such as individual echo signals of an EPI sequence, are then picked up with the same phase encoding but with opposed read-out gradients. This offers the advantage that in accordance with the invention such directly successively acquired MR data can be related to one another in order to monitor the phase errors but can also be combined directly in order to determine an instantaneous phase correction profile.

For real-time MR imaging it may be advantageous to use imaging pulse sequences with interleaved phase encoding steps (a so-called sliding window reconstruction). This offers inter alia the advantage that multiple image reconstruction can take place during a single complete sampling of the k space, thus yielding a higher image rate (see S. Riederer et al., Magnetic Resonance in Medicine, Vol. 8, pp.–15, 1988). If the phase errors are to be monitored in accordance with the invention during such an imaging method, the sign of the read-out gradients is preferably changed after every complete sampling of the k space. This offers the advantage that the phase differences of successively acquired MR signals can be related to one another with each time the same phase encoding but with opposed, equal read-out gradients, as described above, in order to monitor the phase errors or to determine phase correction profiles.

Imaging pulse sequences such as the already mentioned EPI (Echo Planar Imaging) or the EVI (Echo Voluminar Imaging) sequences are particularly suitable for real-time MR imaging. Such ultrafast imaging sequences, in which the read-out gradient is continuously switched to and fro in order to generate gradients, are capable of generating a complete image by means of only a single RF excitation. The acquisition times for a single image are then substantially less than 100 ms. In accordance with the invention the EPI and EVI sequences can be applied in such a manner that individual echo signals of successive acquisitions can be related to one another for continuous monitoring of the phase errors. As described above, this operation is advantageously performed in such a manner that individual echo signals with the same phase encoding and an opposed, equal frequency encoding are combined so as to determine the phase differences. To this end, simply the signs of the read-out gradients of temporally successive EPI or EVI sequences can be periodically changed or the k space can be sampled in a different manner such that MR signals are acquired with the same phase encoding and each time alternating read-out gradients. The monitoring of the phase errors in accordance with the invention then takes place directly on the basis of the image data, without valuable measuring time being wasted on calibration sequences. It may even be that calibration measurements can be completely dispensed with, that is, when the phase correction profiles are also calculated directly (as described above) from the image data.

The MR imaging method in accordance with the invention can be carried out by means of an MR apparatus which includes a gradient coil system for generating magnetic field gradients, an RF coil system for generating RF pulses and for receiving MR signals, a control unit which controls the gradient coils and RF coils so as to apply imaging pulse sequences to an examination zone, and a reconstruction unit which stores MR data which is subjected to a phase correction in order to compensate for phase errors, the reconstruction unit being programmed in such a manner that in parallel with the application of the imaging pulse sequences the phase errors are continuously monitored by relating stored, temporally successively acquired MR data to one another. The method in accordance with the invention can thus be readily implemented in a customary MR tomography apparatus in clinical use, without necessitating any modifications of the hardware. It is merely necessary to adapt the programming of the reconstruction unit. This can be realized by means of a computer program for controlling the MR apparatus which, in order to evaluate phase errors, relates at least two of the MR data sets stored in the reconstruction unit to one another and determines phase differences therefrom. In accordance with the invention such MR data sets are MR image data which is acquired by means of an imaging pulse sequence and evaluated in order to monitor the phase errors. Such a computer program can notably carry out a direct phase correction of the MR data on the basis of the phase differences determined. To this end, the program has to communicate with the control unit so as to relate the MR signals, on the basis of which the phase errors can be monitored, correctly to one another as described above. Such a computer program can be advantageously presented to users of MR apparatus by storing it on a suitable data carrier, such as a disc or a CD-ROM, or by downloading it via a data network.

Embodiments of the invention will be described in detail hereinafter with reference to the Figures. Therein:

Figure 1:
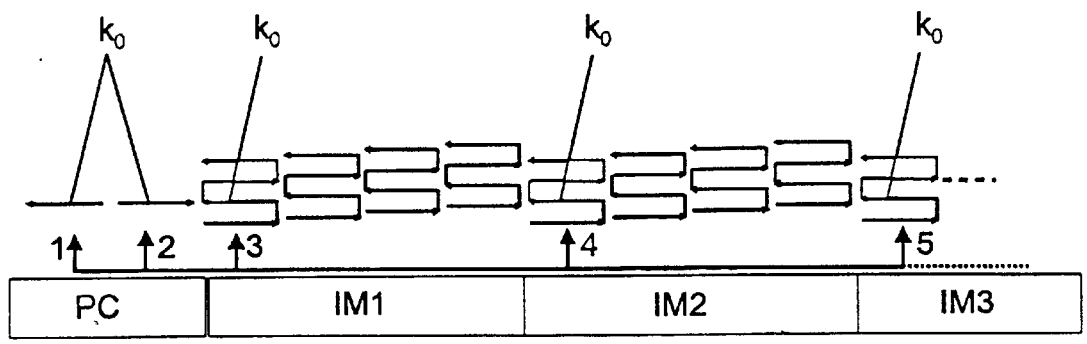
FIG. 1 shows a series of EPI sequences with monitoring of the phase error in accordance with the invention and with a calibration measurement without phase encoding.

FIG. 1 illustrates diagrammatically the execution of an MR imaging operation in accordance with the invention. The chart commences with a brief calibration sequence PC in which two MR signals 1 and 2 with the same phase encoding $k_0$ are acquired with each time an opposed, equal read-out gradient. The course of the arrows in the Figures illustrates the sampling of the two-dimensional k space. The direction of the arrows indicates the sign of the relevant read-out gradient. A phase correction profile is determined from the phase difference between the two MR signals 1 and 2 acquired by way of the calibration sequence; this phase correction profile is subsequently used for the correction of the phase errors. To this end, the two data sets are first formatted, after which one of the two becomes a complex conjugate. Finally, the complex conjugated data set is multiplied point by point by the corresponding data set. At the end the product is normalized to the amount 1. The result of this calculation procedure represents the desired phase correction profile which contains the phase difference as a complex phase factor for each individual data point. The calibration sequence PC is succeeded by the actual imaging phase. EPI sequences with interleaved phase encoding are repeatedly applied for the imaging operation. Each complete sampling IM1–IM3 of the k space consists of four EPI sequences. Image reconstruction is then performed after each individual EPI sequence; to this end, the associated part of the k space is updated each time in the complete image data set. The temporally successive MR data sets 3, 4 and 5 thus acquired contain individual echo signals which have the same phase encoding ko as the MR signals 1 and 2 of the calibration sequence. For the corresponding signals of the measurements 3, 4 and 5 the read-out gradient has a sign opposing that for the signal 2. In order to monitor the phase error in accordance with the invention, said MR signals from the measurements 3, 4 and 5 can be related to the signal 2. This is performed by calculating profiles of the phase differences between the signals 3 and 2, 4 and 2, 5 and 2 etc. and by comparing such profiles with the phase correction profile obtained during the calibration phase. To this end, use is preferably made of a suitable statistical analysis algorithm so as to enable random signal fluctuations to be taken into account. According to this version of the MR imaging method in accordance with the invention, therefore, the phase errors are checked every fourth individual measurement.

Figure 2:
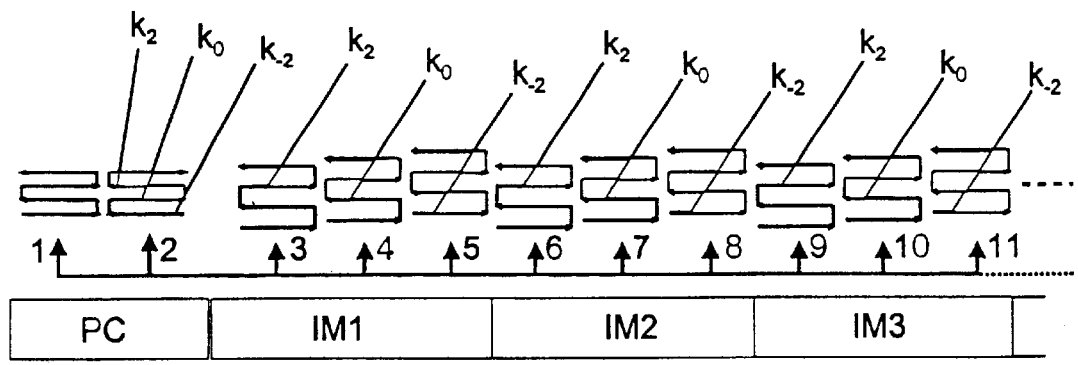
FIG. 2 shows a series of EPI sequences with monitoring of the phase error and with a calibration measurement with phase encoding.

FIG. 2 shows the execution of an MR imaging operation in accordance with the invention wherein the calibration sequence PC with phase encoding is executed. In comparison with the last example described, more frequent checking of the phase errors is thus possible. During the calibration sequence PC measurements are performed with the phase encoding $k_{-2}$, $k_0$ and $k_2$. During the actual imaging operation EPI sequences with interleaved phase encoding are used again; every complete sampling IM1–IM3 of the k space then consists of three individual EPI sequences. Each individual EPI sequence includes a phase encoding step which corresponds to one echo signal of the calibration sequence. In accordance with the described method the MR signals 3 and 2 are related to one another in order to monitor the phase errors; the phase differences between the echo signals with phase encoding $k_2$, acquired each time with opposed read-out gradients, then have to be determined. Analogously, in the further course of the operation the measurements 4 and 2, 5 and 2 etc. are correlated. The signals with the other phase encoding ko, $k_{-2}$ etc. then correspond to one another. According to this version the phase errors are monitored during each individual measurement. Changes in the eddy current behavior can thus be recorded more quickly.

Figure 3:
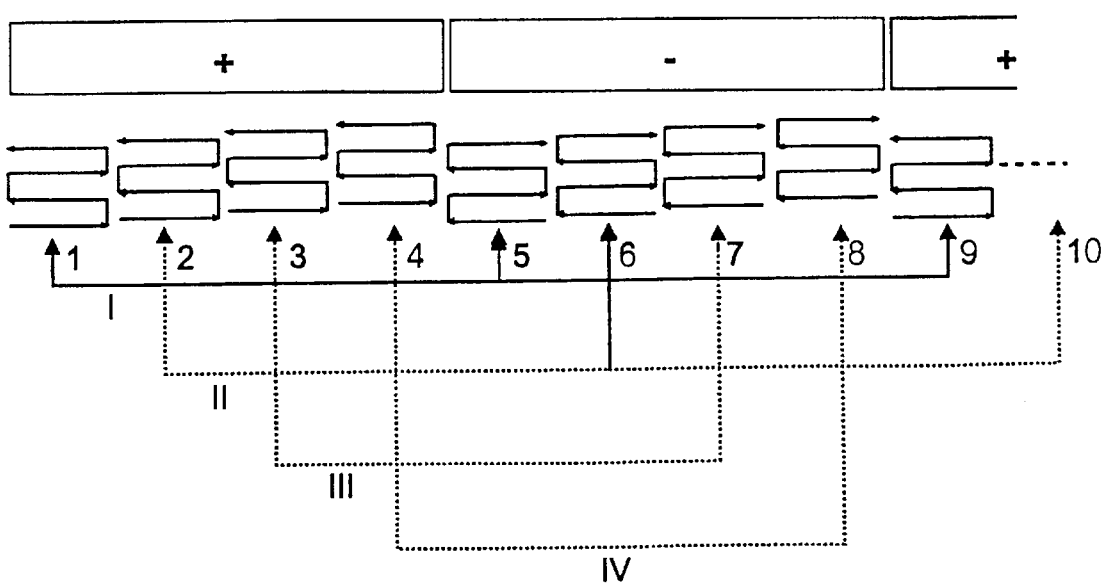
FIG. 3 shows the continuous updating of the phase correction profile by way of a changing sign of the read-out gradients.

The imaging method that is shown in FIG. 3 can be performed completely without carrying out time-consuming calibration measurements for the determination of phase correction profiles. A series of EPI sequences with interleaved phase encoding is used again. After every complete sampling of the k space, consisting of four individual EPI sequences, in accordance with the invention the sign of the read-out gradients is changed. Consequently, phase correction profiles can be determined continuously, that is, in parallel with the actual imaging operation and without any loss of time, in that corresponding MR data sets are related to one another. This is illustrated by the arrows I, II, III and IV in FIG. 3. The individual measurements that are linked by the arrows use each time the same phase encoding steps, the sign of the read-out gradients being changed for the individual echo signals. The data sets that are linked by the arrows, that is, for example, 1 and 5, 2 and 6, 3 and 7 etc., are related to one another in accordance with the invention, the phase correction profiles for compensating the errors that are caused by the eddy currents being determined directly from the phase differences of the corresponding echo signals.

Figure 4:
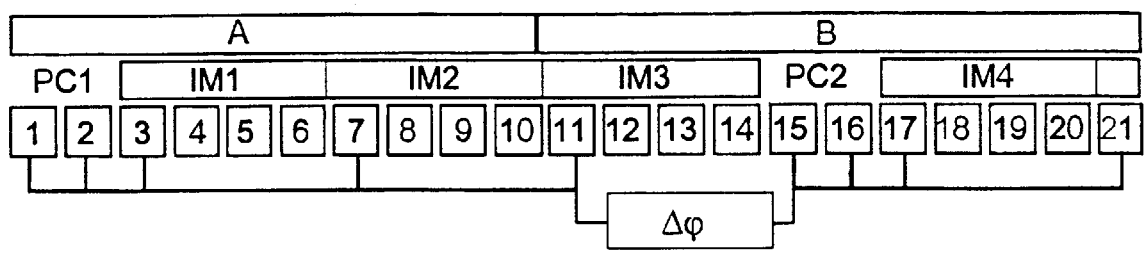
FIG. 4 illustrates diagrammatically the execution of an MR imaging operation in accordance with the invention with automatic monitoring of the phase errors.

FIG. 4 illustrates how the method in accordance with the invention can be used for continuous imaging, a new calibration measurement being automatically initiated as soon as a significant change of the phase errors is detected. The MR imaging commences with a first orientation of the image plane A which is interactively changed to a second, different orientation B in the course of the examination. The imaging sequence commences with the determination of the phase correction profile by way of a calibration measurement PC1 which consists of two separate measurements 1 and 2. Subsequently, EPI sequences 3 to 14 with interleaved phase encoding steps are performed. A complete sampling of the k space includes each time 4 partial measurements. In conformity with the invention, the individual measurements that are linked by lines in FIG. 4 are related to one another in order to detect a change of the phase errors. The first three complete samplings IM1–IM3 are based on the phase correction profile initially determined by way of the calibration measurement PC1. The change of the orientation of the image plane from A to B causes a change of the eddy current behavior; therefore, because of the combining of the measurements 11 and the data of the calibration sequence PC1 a change $\Delta\phi$ of the phase errors is detected. Subsequently, a new calibration PC2 is initiated; in order to compensate for the phase errors in the further course of the imaging operation (IM4, IM5 etc.), said new calibration forms a new phase correction profile.

Figure 5:
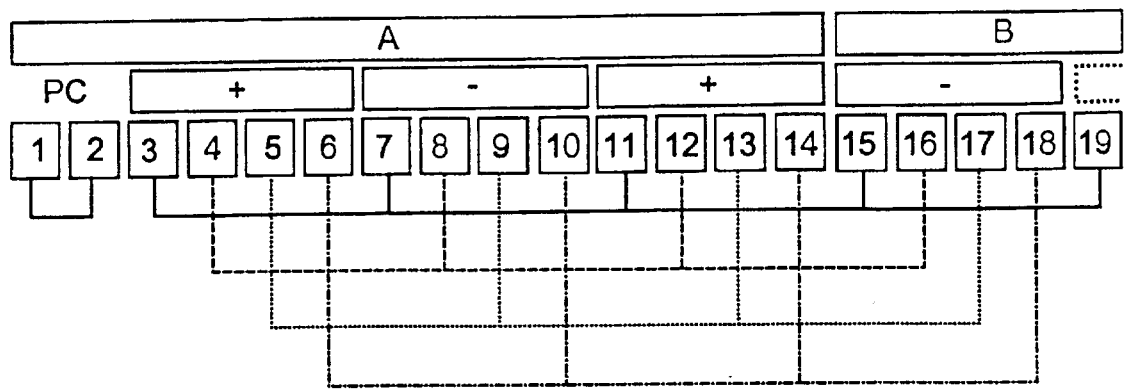
FIG. 5 illustrates diagrammatically the execution of an MR imaging operation in accordance with the invention with continuous updating of the phase correction profile.

FIG. 5 shows a diagram in which the phase correction profile is continuously updated on the basis of the image data. The sequence commences with a calibration sequence PC in order to make a first phase correction profile available. Subsequently, after every complete sampling of the k space, again consisting of each time four individual measurements, the sign of the read-out gradients is changed as described above, so that the individual measurements that are linked by lines in FIG. 5 can be combined so as to update the phase correction profile continuously. When the orientation of the image plane changes from A to B, no new calibration measurement is necessary, because an instantaneous current phase correction profile is continuously generated in conformity with the invention.

Figure 6:
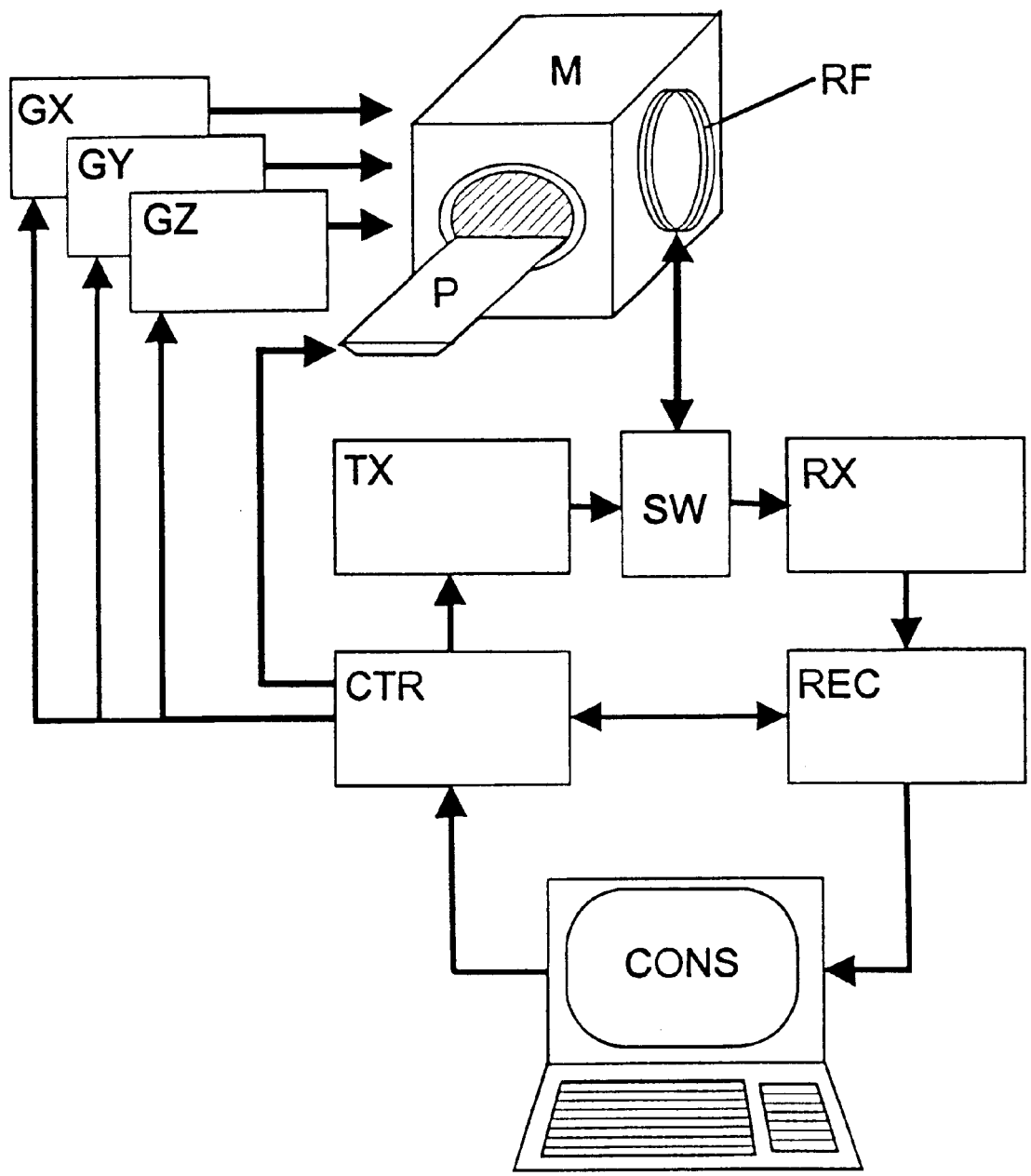
FIG. 6 shows an MR apparatus in accordance with the invention.

FIG. 6 shows diagrammatically an MR apparatus which is suitable for carrying out the method in accordance with the invention. The central component of the apparatus is formed by a main magnet M which generates an essentially homogeneous, stationary magnetic field with a flux density of, for example 1.5 Tesla in an examination zone. The magnet M is customarily a superconducting electromagnet. A patient table P, accommodating patient during an examination, can be moved into the magnet M. The field direction of the magnet M typically extends parallel to the longitudinal direction of the patient table P. There is also provided an arrangement of gradient coils GX, GY, GZ which are powered via gradient amplifiers (not shown). The gradient pulses required for the various pulse sequences can be generated in arbitrary spatial directions in the examination zone by these gradient coils. An RF coil system RF serves to apply RF pulses to the examination zone and to receive MR signals from the examination zone. To this end, the coil system RF can be switched to and fro, via a switch SW, between an RF power transmitter TX and a receiver RX. The transmitter TX is controlled by a control unit CTR which also controls the gradient coils GX, GY and GZ in order to generate the necessary pulse sequences. Moreover, the control unit CTR varies the position of the patient table P. A reconstruction unit REC digitizes and stores the MR signals supplied by the receiver RX, carries out a phase correction on the basis of phase correction profiles that are also stored in the reconstruction unit, and reconstructs images of the examination zone therefrom by two-dimensional or three-dimensional Fourier transformation. The reconstruction unit REC communicates with a control console CONS which includes a monitor on which the reconstructed image data is displayed. The console CONS at the same time serves to operate the entire apparatus and to initiate the desired pulse sequences. To this end the console CONS also communicates with the control unit CTRL.

The MR imaging method in accordance with the invention is implemented by appropriate programming of the reconstruction unit REC. The MR data sets stored therein are related to one another in order to monitor the phase errors as described above, and the phase differences thus determined are subjected to a statistical analysis evaluating the change in time of the eddy currents. The reconstruction unit communicates with the control unit CTR in order to enable correct relation of the individual MR signals on the one hand and, on the other hand, to initiate, if necessary, calibration measurements as soon as a significant change of the phase errors is detected by the program of the reconstruction unit REC in accordance with the invention.

What is claimed is:

1. An MR imaging method, notably for real-time imaging, wherein temporally successive MR data of an object to be examined is acquired by the repeated application of imaging pulse sequences, said MR data being subjected to phase correction in order to compensate for phase errors, characterized in that the phase errors are continuously monitored in parallel with the application of the imaging pulse sequences in that MR data acquired at different instants are related to one another.

2. A method as claimed in claim 1, characterized in that MR data acquired with the same phase encoding and with opposed, equal read-out gradients are related to one another in order to monitor the phase errors.

3. A method as claimed in claim 1, characterized in that MR data acquired with the same phase encoding and with opposed, equal read-out gradients are combined in order to calculate a phase correction profile.

4. A method as claimed in claim 1, characterized in that a calibration pulse sequence for measuring a phase correction profile is initiated as soon as a significant change of the phase errors is detected.

5. A method as claimed in claim 1, characterized in that the sign of the read-out gradients is changed for the successively applied imaging pulse sequences.

6. A method as claimed in claim 1, characterized in that use is made of successive imaging pulse sequences with interleaved phase encoding steps, the sign of the read-out gradients being changed after a complete sampling of the k space.

7. A method as claimed in claim 1, characterized in that the imaging pulse sequences are EPI (Echo Planar Imaging) or EVI (Echo Voluminar Imaging) sequences.

8. An MR apparatus for carrying out the method claimed in claim 1, which apparatus includes a gradient coil system (GX, GY, GZ) for generating magnetic field gradients, an RF coil system (RF) for generating RF pulses and for receiving MR signals, a control unit (CTR) which controls the gradient coils and the RF coils so as to apply imaging pulse sequences to an examination zone, and a reconstruction unit (REC) which stores MR data which is subjected to a phase correction in order to compensate for phase errors, characterized in that the reconstruction unit (REC) is programmed in such a manner that in parallel with the application of the imaging pulse sequences the phase errors are continuously monitored by relating stored, temporally successively acquired MR data to one another.

9. A computer program for controlling an MR apparatus as claimed in claim 8, characterized in that the program relates at least two MR data sets to one another and determines phase differences therefrom in order to evaluate phase errors.

10. A computer program as claimed in claim 9, characterized in that the program executes a phase correction of the MR data on the basis of the phase differences determined.

* * * * *